United States Patent [19]
Yamada et al.

[11] 4,000,247
[45] Dec. 28, 1976

[54] DIELECTRIC ACTIVE MEDIUM FOR LASERS

[75] Inventors: Tomoaki Yamada, Mitaka; Kenju Otsuka, Musashino; Harue Suzuki, Sagamihara; Jun-Ichi Nakano, Tachikawa, all of Japan

[73] Assignee: Nippon Telegraph and Telephone Public Corporation, Tokyo, Japan

[22] Filed: Feb. 23, 1976

[21] Appl. No.: 660,015

Related U.S. Application Data

[63] Continuation-in-part of Ser. No. 579,249, May 20, 1975, abandoned.

[30] Foreign Application Priority Data

May 27, 1974 Japan .......................... 49-59471

[52] U.S. Cl. .............................. 423/263; 423/306; 252/63.5; 252/301.4 P; 331/94.5 F
[51] Int. Cl.² .................................. C09K 11/46
[58] Field of Search ........................ 423/263, 306; 252/301.4 P, 63.5; 331/94.5 F

[56] References Cited
UNITED STATES PATENTS

| | | |
|---|---|---|
| 3,580,859 | 5/1971 | Buzhinsky et al. ...... 252/301.4 P X |
| 3,813,613 | 5/1974 | Danielmeyer et al. ... 252/301.4 P X |
| 3,846,142 | 11/1974 | Buzhinsky et al. ...... 252/301.4 P X |

OTHER PUBLICATIONS

Beryl et al. "Chem Abstracts" vol. 63, 1965, p. 2613g.
Chinn et al. "Applied Physics Lett.", 1975, 26(11) pp. 649–51.

*Primary Examiner*—Jack Cooper
*Attorney, Agent, or Firm*—Flynn & Frishauf

[57] ABSTRACT

A single crystal essentially consists of $XM_zM'_{1-z}P_4O_{12}$, ($0 < z \leq 1$) in which X is lithium and/or sodium, M is neodymium, and M' is yttrium, lanthanum or gadolinium.

Said single crystal can be used as a dielectric active medium for lasers, and can be prepared in the form of a bar having a square cross section measuring 5 mm on each side by the top-seeded solution growth method.

4 Claims, 6 Drawing Figures

DIELECTRIC ACTIVE MEDIUM FOR LASERS

CROSS-REFERENCE TO RELATED APPLICATION

This is continuation-in-part of the U.S. Pat. application Ser. No. 579,249 filed May 20, 1975, and now abandoned.

This invention relates to a single crystal used as a dielectric active medium for solid-state lasers and more particularly to a single crystal of lithium neodymium tetraphosphate ($LiNdP_4O_{12}$) and a substituted form thereof which can attain the oscillation of pulses by dye laser pumping or that of continuous waves by argon laser pumping.

The U.S. Pat. No. 3,813,613 has already set forth neodymium pentaphosphate ($NdP_5O_{14}$), the single crystal of which can be made available as a dielectric active medium for solid-state lasers.

The present inventors have carefully studied the properties of compounds formed of a mixture of $Li_2O$, $Nd_2O_3$ and $P_2O_5$, and as the result have discovered that a single crystal of lithium neodymium tetraphosphate ($LiNdP_4O_{12}$) is a dielectric active medium for solid-state lasers which displays a prominent fluorescent property.

It is accordingly an object of this invention to provide a high quality single crystal for lasers which can be prepared in a large size and present excellent fluorescence.

Another object of the invention is to provide a dielectric active medium for lasers which consists of a single crystal of lithium neodymium tetraphosphate.

Still another object of the invention is to provide a dielectric active medium for lasers which consists of a single crystal of a neodymium tetraphosphate and in which the whole or part of the lithium contained in the tetraphosphate is replaced by sodium.

A further object of the invention is to provide a dielectric active medium for lasers which consists of a single crystal of a neodymium tetraphosphate and in which part of the neodymium is replaced by any of trivalent rare earth elements such as yttrium, lanthanum and gadolinium.

An active medium for lasers according to this invention is a single crystal whose chemical structure is expressed by the general formula:

where:

X = at least one of alkali metal element such as lithium and sodium

M = neodymium

M' = trivalent rare earth element such as yttrium, lanthanum and gadolinium.

Preferred range of $z = 0.5$ to 1

This invention can be more fully understood from the following detailed description when taken in conjunction with the accompanying drawings, in which.

Figure 4:
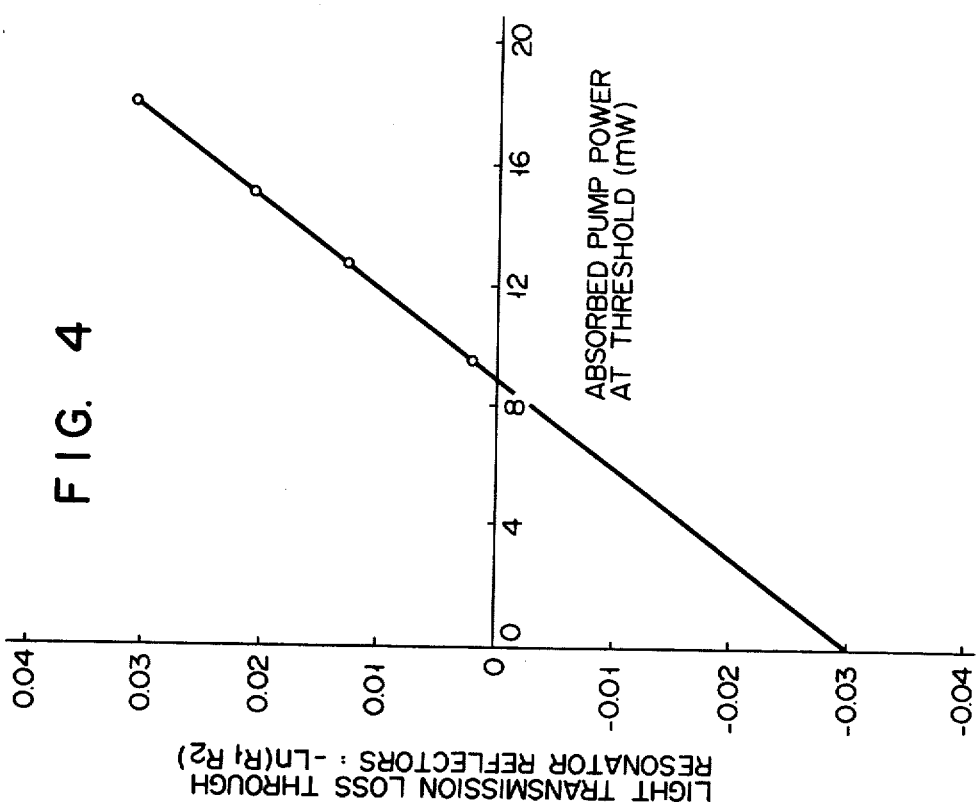
Figure 5:
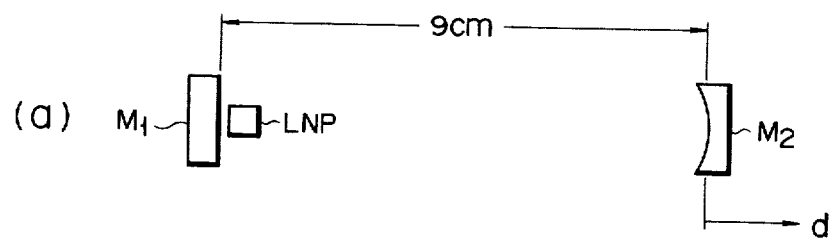
Figure 5:
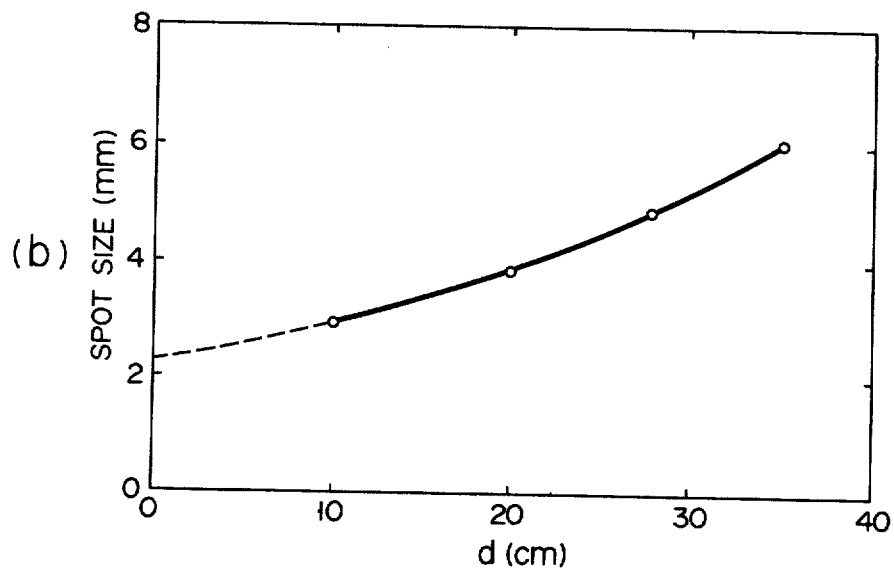
Figure 5:
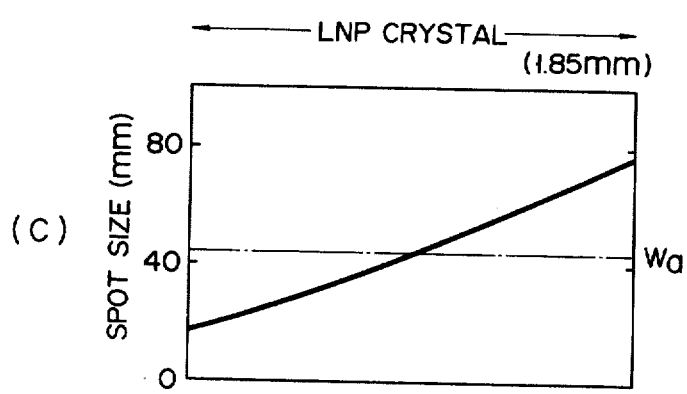
Figure 6:
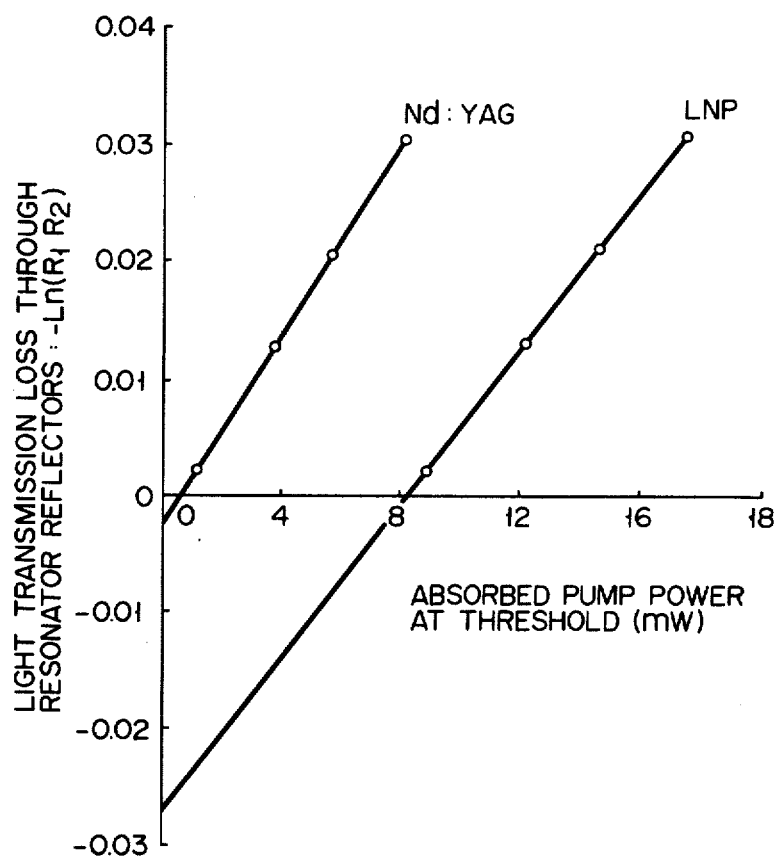

where:

R = lanthanum, yttrium or gadolinium;

FIG. 4 indicates a relationship between the loss of a light during its transmission through the reflectors constituting a resonator of a laser using $LiNdP_4O_{12}$ (hereinafter abbreviated as "LNP") crystal and the threshold energy for laser oscillation;

FIG. 5(c) presents a spot size in said LNP crystal;

FIGS. 5(a) and 5(b) set forth sources from which values plotted on a curve shown in FIG. 5(c) were measured; and FIG. 6 compares a relationship between the light transmission loss through resonator-reflectors and the threshold energy for laser oscillation associated with a laser using Nd-doped yttrium aluminium garnet ($Y_3Al_5O_{12}$) crystal with a similar relationship relative to a laser employing LNP crystal.

Where continuous waves are oscillated by a highly efficient active laser medium containing neodymium which is used as a component of a light communication source device, optical gain g in light amplification may be expressed by the following formula:

$$g = N_{abs} \tau \sigma \qquad (1)$$

where:

$N_{abs}$ = number of absorbed photon rate of pumping light per unit volume $\tau$ = fluorescent lifetime $\sigma$ = light quantity (also referred to as "laser transition cross section") emitted per active ion, for example $Nd^{3+}$ ion Where comparison is made on the basis of the same light quantity, $N_{abs}$ is proportional to the concentration of active ions, for example, $Nd^{3+}$ ions. Where the guantum efficiency of a fluorescent light indicates 1, $\sigma$ is inversely proportional to its linewidth $\Delta\lambda$ (where $\Delta\lambda$ denotes a full width at half maximum of a fluorescent light bearing the Lorentzian line shape). Where the quantum efficiency stands at 1, then it is proved that excited $Nd^{3+}$ ions never fail to emit a fluorescent light without giving fluorescence quenching. $\sigma$ is proportional to the ratio at which some proportion of a fluorescent light admitting of laser oscillation bears to the whole of said fluorescent light (this ratio is also referred to as a "branching ratio"). It is seen from the foregoing description that the spectroscopic requisites for a dielectric active medium for solid-state lasers include, for example, (1) that the medium contains active ions at high concentration and effectively absorbs a pumping light; (2) that the medium emits a fluorescent light little subject to quenching and has a long fluorescent life; and (3) that a fluorescent light emitted by the medium has a narrow radiative linewidth, attaining a large branching ratio. An active medium meeting particularly the requirements (1), (2) generally produces a fluorescent light of high intensity.

This invention relates to lithium neodymium tetraphosphate ($LiNdP_4O_{12}$) and a substituted form thereof which the present inventors have found to be novel solid active media for lasers as the result of studying those of the compound formed of a mixture of $Li_2O$, $Nd_2O_3$ and $P_2O_5$ which can display a fluorescent property.

The subject active medium is prepared by the following process. Homogeneously mixed powders consisting of, for example, 3 mols of $Li_2CO_3$, 1 mol of $Nd_2O_3$ and 14 mols of $NH_4H_2PO_4$ are molded into a shape and thereafter baked about 2 hours at a temperature of around 800° C in an electric furnace to provide a raw material for a single crystal. The baked raw material is thermally melted at a temperature of around 950° C in a platinum crucible. A desired single crystal is grown out of said molten liquid using a seed crystal by the well known Kyropoulos method (also referred to as the "top-seeded solution growth method"). Where, during the growth of the above-mentioned single crystal, the seed crystal received in the crucible is pulled up at a lower rate than 0.1 mm/hour while being rotated at the rate of 20 to 60 revolutions/minute, then a single crystal bar having a square cross section measuring 5 mm on each side can be obtained.

The chemical composition of the single crystal thus formed was proved to be $LiNdP_4O_{12}$ by the undermentioned processes of determination. The crystal had a density of 3.39 g.cm$^{-3}$ when the number of $LiNdP_4O_{12}$ particles contained in a unit cell of the crystal was measured to be 4 from the lattice constant of said crystal which was determined on the basis of the lattice constant of calcium carbonate. The actually determined density of said crystal was 3.4 g.cm$^{-3}$.

Figure 1:
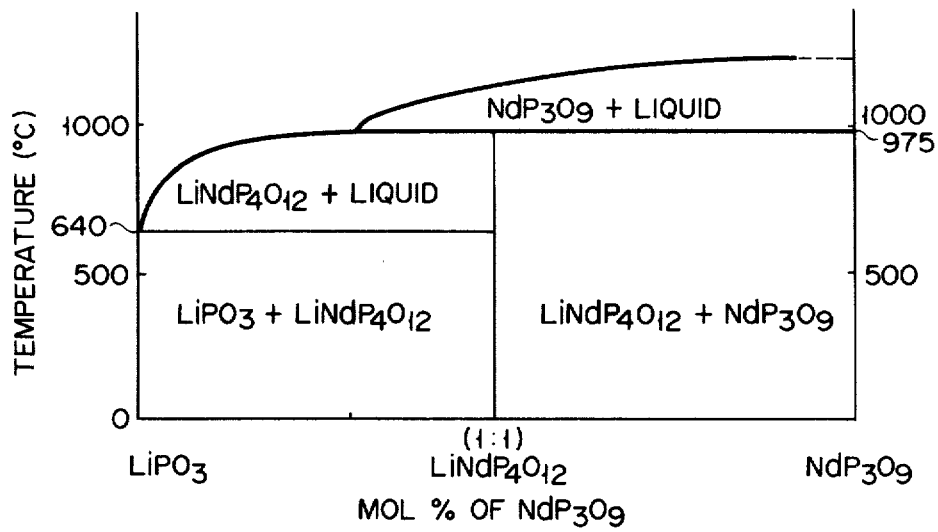
FIG. 1 is a phase diagram of a pseudo-binary $LiPO_3$—$NdP_3O_9$ system.

Quantitative chemical analysis showed that Li, Nd and P had percentage proportions by weight of 1.3 ± 0.2, 31 ± 3, and 28 ± 2 respectively. The proportions of the components Li, Nd and P of said single crystal (which was supported to be a system of $LiNdP_4O_{12}$) were calculated to be 1.5, 31 and 26.5 respectively. Differential thermal analysis and X-ray diffraction analysis were made of samples of a pseudo-binary system $LiPO_3$—$NdP_3O_9$. The experimental results showed that a compound having the same composition as the $LiNdP_4O_{12}$ single crystal was observed in those samples in which $LiPO_3$ and $NdP_3O_9$ had a molar ratio of 1:1 and that said pseudo-binary system of $LiPO_3$-$NdP_3O_9$ did not contain any other compound. The phase of said pseudo-binary system of $LiPO_3$-$NdP_3O_9$ is set forth in FIG. 1.

Table 1 below shows the properties of a $LiNdP_4O_{12}$ (LNP) single crystal compared with those of a $NdP_5O_{14}$ (NdPP) single crystal and also with those of a single crystal of Nd"YAG (namely, a garnet type single crystal YAG ($Y_3Al_5O_{12}$) containing $Nd^{3+}$).

Figure 2:
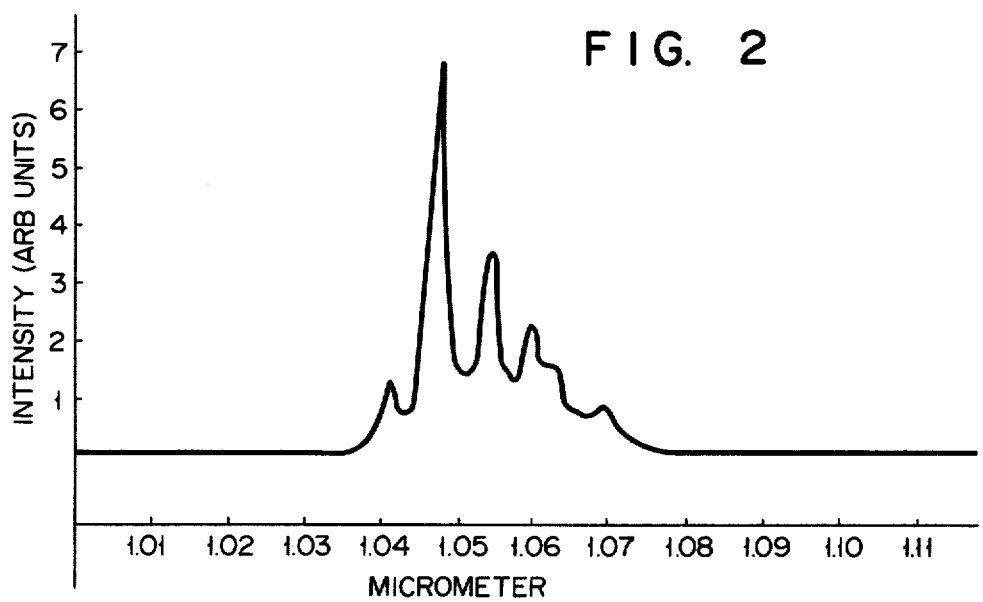
FIG. 2 is a fluorescent spectrum of lithium neodymium tetraphosphate.

FIG. 2 sets forth the fluorescent spectral values of a $LiNdP_4O_{12}$ single crystal when transition takes place from an energy level of $4_{r_{3/2}}$ to that of $4_{l_{11}}$.

$LiNdP_4O_{12}$ can be partly replaced by ions of yttrium and those of other rare earth elements and alkali metals.

A single crystal of $LiRP_4O_{12}$ (where R denotes lanthanum, yttrium or gadolinium) belongs to an orthorhombic system closely resembling that of the $LiNdP_4O_{12}$ single crystal or a monoclinic (pseudo-orthorhombic) system.

A single crystal of $NaRP_4O_{12}$ (where R denotes neodymium, lanthanum, gadolinium or yttrium) belongs to a monoclinic system resembling that of the $LiNdP_4O_{12}$ single crystal. The $NaNdP_4O_{12}$ single crystal has a fluorescent life of 110 microseconds.

Table 2 below indicates the lattice constants (A) of the crystal axes of the pseudo-orthorhombic system of the above-mentioned $LiRP_4O_{12}$ single crystal. Characters $a, b, c$ given in Table 2 below indicate the crystal axes.

Table 2

|  | a | b | c |
|---|---|---|---|
| $LiNdP_4O_{12}$ | 9.74 | 13.26 | 7.08 |
| $LiLaP_4O_{12}$ | 9.82 | 13.29 | 7.07 |
| $LiGdP_4O_{12}$ | 9.64 | 13.21 | 7.09 |
| $LYP_4O_{12}$ | 9.55 | 13.15 | 7.06 |

Figure 3:
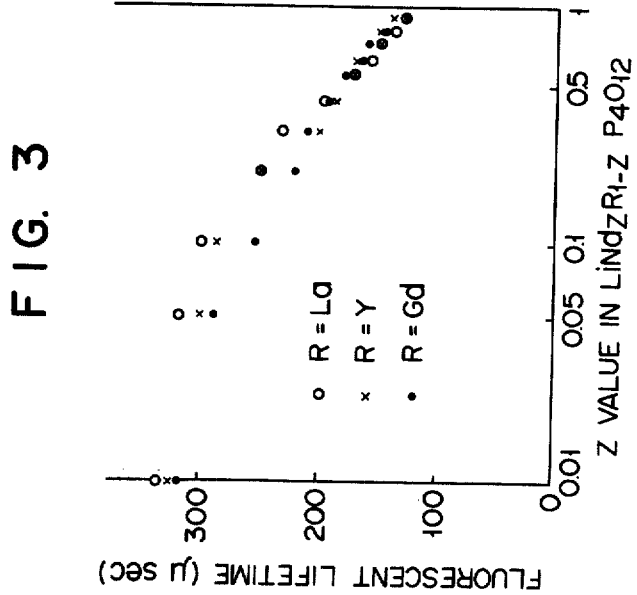
FIG. 3 shows the fluorescent lifetime of a system whose chemical structure may be expressed by the general formula.

FIG. 3 shows the fluorescent lifetime of a single crystal of $LiNd_xP_{1-x}P_4O_{12}$ (where R denotes lanthanum, yttrium or gadolinium).

The subject $LiNdP_4O_{12}$ single crystal has the following characteristics: (1) the crystal contains an active ion of Nd at a high concentration of $4.4 \times 10^{21}$ cm$^{-3}$; (2) the crystal gives forth a fluorescent light little subject to quenching and has a relatively long fluorescent lifetime as 120 microseconds; (3) the crystal provides a large laser transition cross section; (4) the crystal produces a polarized laser output; and (5) the crystal can be prepared in a large size.

The $LiNdP_4O_{12}$ single crystal attains oscillation of pulses by dye laser pumping and that of continuous waves by argon laser pumping. The oscillation of pules Table 1

| System | LNP | NdPP | Nd:YAG |
|---|---|---|---|
|  | Monoclinic | Monoclinic | Cubic |
| Space group | C2/c | P2$_1$/c | Ia3d |
| Lattice constant | a=16.45A, b=7.07A c=13.25A, β=143°37' | a=8.76A, b=8.99A c=13.03A, β=90.5° | a=12.01A |
| Refractive index(6328A) | 1.83 |  |  |
| Density (g/cm$^3$) | 3.4 | 3.6 | 4.55 |
| Nd concentration (10$^{21}$ cm$^{-3}$) | 4.37 | 3.96 | 0.14 |
| Fluorescent lifetime (μ sec) | 120 | 120 | 230 |
| Laser line peak (μ m) | 1.047$_7$ | 1.051 | 1.064 |
| Linewidth (A) | 17* | 30 | 5 |
| Transition cross section (10$^{-19}$ cm$^2$) | 3.2* | 1.1 | 1.8 |

Note:
a mark * denotes a value measured of a light polarized in parallel with the b axis (the c axis of a pseudo-rhombic system) along which a laser-oscillated light is polarized.

by dye laser pumping can be carried out at room temperature with a light from the dye laser used as a pumping light in a resonator of the known type. The construction of a resonator used with the dye laser will be illustrated in an article by K. Otsuka et al which is expected to appear in the June issue of the Journal of Applied Physics, 1975.

The present inventors' experiments show that a 300 μm thick a-plate of the $LiNdP_4O_{12}$ single crystal of pseudo-orthorhombic system absorbed 22% of a light (whose wavelength λ was 5965A) from the dye laser. In this case, a spot size of the resonator was 180 μm and a threshold energy for laser oscillation was 140 μJ. Where the above-mentioned $LiNdP_4O_{12}$ single crystal was replaced by a single crystal of Nd:YAG having a longest dimension of 8 mm between the parallel surfaces which absorbed 21% of a light from the dye laser, a threshold value for laser oscillation was substantially the same as in the case of the $LiNdP_4O_{12}$ single crystal.

Oscillation of continuous waves by argon laser pumping ca be effected at room temperature using a resonator of the known type, with a light (whose wavelength λ was 5145A) from the argon laser. The construction of the above-mentioned resonator will be exemplified in an article by Otsuka et al which will appear in the July, 1975 issue of the IEEE Journal of Quantum Electronics and the Applied Physics Letters, 26, 311, 1975.

The present inventors' experiments showed that lasing action was satisfactorily attained, no matter how pumping was carried out, namely, whether a light issued from an argon laser was applied in a direction aligned with the axis of the resonator used with a $LiNdP_4O_{12}$ laser, (this process is known as "end pumping"), or at right angles to said axis (this process is referred to as "side pumping"). This invention has enabled for the first time a laser containing Nd compounds to oscillate a light emitted therefrom by side pumping. An output light from a laser containing a $LiNdP_4O_{12}$ single crystal prepared by the method of the invention is polarized along the axis c of a pseudo-rhombic system presented by said crystal (namely, the axis b of a monoclinic system). A light from a laser containing a single crystal of Nd pentaphosphate is not polarized.

The threshold value $P_{th}$ for oscillation of continuous waves may be expressed by the following formula:

$$P_{th} = \frac{L_c h \nu \pi \omega_0^2}{2\sigma_l \tau} \quad (2)$$

where:

$L_c$ = loss of a light while making one round trip in a resonator (this loss results from a combination of causes such as the loss of a light during its propagation through a crystal, during its diffraction in a laser reso-nator and during its transmission or permeation through the reflectors constituting a resonator. The loss of a light during its transmission through said reflectors may be expressed as $-l_n(r_1 r_2)$ with the reflection indices of a light denoted by $r_1$ and $r_2$).

$h$ = Planck's constant
$\nu$ = frequency of pumping light waves
$\pi$ = circular constant (ratio of the circumference of a circle to its diameter)
$\omega_0$ = spot size
$\sigma_l$ = laser transition cross section from an energy level of $4_{F_{3/2}}$
$\tau$ = fluorescent lifetime $L_c$ can be determined by measuring a threshold energy for laser oscillation with the reflection indices $r_1$ and $r_2$ of the reflectors changed. $\omega_0$ can be estimated by measuring the divergence of an output light from a laser and then calculating a spot size in a laser resonator.

FIG. 4 illustrates the manner in which $L_c$ is determined. With the reflection indices of the resonator reflectors designated as $r_1$ and $r_2$, there results $L_c = -l_n(r_1 r_2) + l_c$ and $L_c = K P_{th}$ (where $l_c$ denoted the loss of a light resulting from other causes than its transmission through the resonator reflectors, $K$ is a constant, and $P_{th}$ is a threshold value). Accordingly, $-l_n(r_1 r_2) = K P_{th} - l_c$ results. A value of $-l_c$ can be determined by measuring $P_{th}$ with $r_1$ and $r_2$ changed and finding such a value of $-l_n(r_1 r_2)$ as gives $P_{th} = 0$ from a coordinate system indicating relationship between $-l_n(r_1 r_2)$ and $P_{th}$. FIG. 4 shows that with a crystal length taken to be 1.85 mm and in case of $r_1 = 1$ and $r_2 = 1$, then the loss of a light during its one round trip through a laser resonator is 0.03. In case of $r_1 < 1$ and $r_2 < 1$, $L_c$ shows a value of $-l_n(r_1 r_2) + 0.03$.

FIG. 5(a) illustrates the construction of a resonator adopted in this invention. $M_1$ and $M_2$ denote reflectors. The radium curvature of the reflector $M_2$ is 9 cm. d shown in FIGS. 5(a) and 5(b) represents a distance measured from the reflector $M_2$. In FIG. 5(b), the ordinate represents the spot size of an output light from a laser, and the abscissa d denotes a distance measured from the reflector $M_2$ of FIG. 5(a). In FIG. 5(c), the ordinate shows said spot size occurring in a LNP single crystal as calculated from FIG. 5(b). As seen from FIG. 5(c), a spot size in a crystal locally varies. However, the spot size on FIG. 5(c) is substantially equivalent to a uniform spot size of 43 μm indicated by a straight dot-dash line of FIG. 5(c). The reason is that the mode volume (the volume of that portion of a crystal in which laser oscillation takes place) of FIG. 5(c) is the same as in the case of said 43 μm spot size.

The above-mentioned measurements are set forth in Table 3 below.

Table 3

|   | l | Pumping method | $L_c$ | $\omega_0$ | $P_{th}$ | $\sigma_l$ |
|---|---|---|---|---|---|---|
|   | 0.7 mm | end | 0.051 | 55μm | 2.78mW | $3.05 \times 10^{-19}$ cm² |
|   | 1.85 | end | 0.042 | 34 | 7.6 | 3.20 |
|   | 1.85 | side | 0.042 | 34 | 70 | 3.20 |
| I | 2.0 | end | 0.080 | 55 | 41.7 | 2.92 |
|   | 2.57 | side | $0.102_b$ | 61 | 168 | 3.04 |
|   | 3.67 | side | $0.12_1$ | 66 | 196 | 3.33 |
| II | 0.95 | end | 0.04 | 86 | 50 | 2.2 |

Note:
I and II represent $LiNdP_4O_{12}$ and $LiGd_{0.5}Nd_{0.5}P_4O_{12}$ respectively. l shows a crystal length. The pumping light used consisted of an argon light having a wavelength of 5145A.

Where comparison was made between the threshold values $P_{th}$ for laser oscillation obtained in both end and side pumping processes, a pumping efficiency $\eta$ of the side pumping process could be obtained. The larger $\omega_0$, the higher $\eta$. Where, in FIG. 3, a crystal length was 3.67 mm, $\eta$ was 0.40 and a slope efficiency immediately after commencement of laser oscillation was 0.04₅. The side pumping provided a higher threshold value $P_{th}$ than the end pumping. Where, however, pumping was effected by a light-emitting diode, there was the advantage that a light given forth by said light-emitting diode more decreased in intensity per unit of the crystal length as said length increased. The reason is that the threshold value $P_{th}$ per unit of a crystal length is proportional to $\alpha_r + \beta_c/2l$, (where $\alpha_c$ denotes the loss of a light during its propagation through the crystal, $\beta_c$ indicates the loss of a light resulting from other causes, and $l$ represents a crystal length). For example, $P_{th}$ decreases from 65 mW/mm in the case of a crystal length of 2.57 mm to 53 mW/mm in the case of a crystal length of 3.67 mm. Where a $LiNdP_4O_{12}$ single crystal 5 mm long is excited by a light-emitting diode of $Ga_{1-x}Al_xAs$ which gives forth a light whose central wavelength is 8000A and whose width is 200A, the resultant threshold value $P_{th}$ is estimated from Table 3 to be 30 mW/mm ($\omega_0 \approx 70\mu m$).

When calculated from data given in Table 3, the loss of a light during its propagation through the $LiNdP_4O_{12}$ single crystal indicates a considerably larger value of 0.084 cm$^{-1}$ than 0.002$^{-1}$ obtained with the Nd:YAG single crystal.

To decrease a threshold value in the side pumping, it is desired that an oscillation region be drawn as much near the surface of a single crystal as possible to elevate pumping efficiency. However, this procedure has the drawback that the oscillation region tends to swell to the outside in the neighborhood of the surface of a single crystal, resulting in the increased $L_c$. An attempt was made to minimize said resonator loss ($L_c$) by sputtering stripes of glass (for example, Corning glass 7059) on the surface of the $LiNdP_4O_{12}$ single crystal with a width of 260 $\mu$m and to a thickness of about 7000A. Where comparison was made between oscillation in the striped portions of the surface of said $LiNdP_4O_{12}$ single crystal and in the nonstriped portion thereof, it was found that provision of glass stripes reduced a threshold value about 20 percent.

More minute comparison was made between the laser transition cross section $\sigma_l$ of the $LiNdP_4O_{12}$ single crystal and that of the Nd:YAG single crystal by end pumping using the argon laser than in the case of end pumping by the dye laser. In this case the Nd:YAG single crystal had a length of 2.6 mm and the $LiNdP_4O_{12}$ (LNP) single crystal had a length of 3 mm. Both crystals had the same optical lengths. Determination was made of relationship between the loss of a light during its round trip in a laser resonator and a threshold energy for laser oscillation with respect to both crystals with arrangement made to provide an equal spot size, the results being set forth in FIG. 6. With the resonator loss (or cavity loss) designated as $L_c$, the threshold value as $P_{th}$ and the fluorescent lifetime as $\tau$, the following formula results:

$$\frac{\sigma_l(LNP)}{\sigma_l(YAG)} = \left[ \frac{L_c(LNP)}{P_{th}(LNP)} \bigg/ \frac{L_c(YAG)}{P_{th}(YAG)} \right] \frac{\tau(YAG)}{\tau(LNP)} \quad (3)$$

$L_c/P_{th}$ shows the inclination of straight lines given in FIG. 6. Where said inclination is determined from said FIG. 6, and $\tau(YAG) = 230$ $\mu s$, and $\tau(LNP) = 120$ $\mu s$ are substituted in the above formula (3), then the following formula results:

$$\sigma_l(LNP) = 1.65\sigma_l(YAG) \quad (4)$$

Further where $1.8 \times 10^{-19}$ cm$^2$ (adopted from S. Singh. R.G. Smith and L.G.Van Vitert, Phys. Rev. B 10, 2566, 1974) is substituted in the above formula (4), then the following formula is given:

$$\sigma_l(LNP) = 3.0 \times 10^{-19} \text{ cm}^2$$

A substituted form of $LiNdP_4O_{12}$, for example, $LiNd_{0.5}Gd_{0.5}P_4O_{12}$ was also proved to enable the resultant laser to carry out oscillation of continuous waves at room temperature. An output light from a laser containing said $LiNd_{0.5}Gd_{0.5}P_4O_{12}$ single crystal was polarized along the axis c of a pseudorhombic system presented by said crystal.

This invention will be more fully understood by the examples which follow.

EXAMPLE 1 ($LiNdP_4O_{12}$)

Mixed powders consisting of 3 mols of lithium carbonate having three to five 9-purity, 1 mol of $Nd_2O_3$ having three to four 9-purity and 14 mols of $NH_4H_2PO_4$ commercially available as a special grade reagent were molded into a shape under pressure, and baked about 2 hours at around 800° C in an electric furnace. The baked mass was thermally melted at 950° C in a platinum crucible having an inner volume of 100 cm³. The subject single crystal was grown out of said molten liquid by the Kyropoulos method, using a previously provided seed crystal.

The molten liquid consisted of $Li_2O$, $Nd_2O_3$ and $P_2O_5$ mixed in the molar ratio of 3:1:7. The molten liquid in the molar ratio of 10:4:25 or 4:1:8 could be also used. The subject single crystal was formed under the conditions in which the molten liquid was cooled at the rate of 0.1° C/hour, and the seed crystal was rotated at the rate of 20 to 60 r.p.m and pulled up at a speed of 0.1 mm/hour, providing a transparent single crystal of $LiNdP_4O_{12}$ having a square cross section measuring 5 mm on each side. When actually determined by chemical analysis, the amount of Li was 1.3 ± 0.2% by weight, that of Nd 31 ± 3% by weight and that of P 28 ± 2% by weight. When calculated, the amount of Li was 1.5% by weight, that of Nd 31 % by weight and that of P 26.5% by weight.

EXAMPLE 2 ($NaNdP_4O_{12}$)

Mixed powders consisting of 4 mols of sodium carbonate having three to five 9-purity, 1 mol of $Nd_2O_3$ having three to four 9-purity and 16 mols of $NH_4H_2PO_4$ commercially available as a special grade reagent were molded into a shape under pressure and baked about 2 hours at around 700° C in an electric furnace. The baked mass was thermally melted at around 850° C in a platinum crucible having an inner volume of 100 cm³.

The molten liquid consisted on $Na_2O$, $Nd_2O_3$ and $P_2O_5$ mixed in the molar ratio of 4:1:8. The subject single crystal was grown out of said molten liquid by the Kyropoulos method, using a previously provided seed crystal. In this case, the molten liquid was cooled at the rate of 0.1° C/hour, and the seed crystal was rotated at the rate of 20 to 60 r.p.m. and pulled up at a speed of 0.1 mm/hour, providing a transparent single crystal of $NaNdP_4O_{12}$ having a square cross section measuring 2 to 5 mm on each side.

EXAMPLE 3 ($LiNd_{0.5}Gd_{0.5}P_4O_{12}$)

Mixed powders consisting of 4 mols of lithium carbonate having three to five 9-purity, 0.5 mol of $Nd_2O_3$ having three to five 9-purity, 0.5 mol of $Gd_2O_3$ having three to five 9-purity and 16 mols of $NH_4H_2PO_4$ commercially available as a special grade reagent were molded into a shape under pressure and baked about 2 hours at around 800° C in an electric furnace. The baked mass was thermally melted around 920° C in a platinum crucible having an inner volume of 100 cm³. The molten liquid consisted of $LiO_2$, $Nd_2O_3$, $Gd_2O_3$ and $P_2O_5$ mixed in the molor ratio of 8 : 1 : 1 : 16. The subject single crystal was grown out of said molten liquid by the Kyropoulos method, using a previously provided seed crystal.

In this case, the molten liquid was cooled at the rate of 0.1° C/hour, and the seed crystal was rotated at the rate of 20 to 60 r.p.m. and pulled up at a speed of 0.1 mm/hour, providng a transparent single crystal of $LiNd_{0.5}Gd_{0.5}P_4O_{12}$ having a square cross section measuring 5 mm on each side.

What we claim is:

1. A dielectric active medium for lasers which consists of a tetraphosphate single crystal whose chemical structure is expressed by the general formula:

$$XM_zM'_{1-z}P_4O_{12} \ (0 < z \leq 1)$$

where:
X = at least one of alkali metal elements Li and Na
M = element of neodymium
M'= at least one rare earth element selected from the group consisting of yttrium, lanthanum and gadolinium.

2. A dielectric active medium for lasers according to claim 1, wherein the single crystal has a composition of $LiNdP_4O_{12}$.

3. A dielectric active medium for lasers according to claim 1, wherein the single crystal has a composition of $NaNdP_4O_{12}$.

4. A dielectric active medium for lasers according to claim 1, wherein the single crystal has a composition of $LiNd_{0.5}Gd_{0.5}P_4O_{12}$.

* * * * *

UNITED STATES PATENT AND TRADEMARK OFFICE
CERTIFICATE OF CORRECTION

PATENT NO. : 4,000,247
DATED : December 28, 1976
INVENTOR(S) : TOMOAKI YAMADA et al It is certified that error appears in the above-identified patent and that said Letters Patent are hereby corrected as shown below:

Column 2, line 37: replace "guantum" with --- quantum ---.

Column 3, Table 1:
    next to "Refractive index...", (third line):
    first column, replace "1.83" with --- 1.58 ---;
    second column, insert --- 1.62 ---;
    third column, insert --- 1.83 ---.

Column 4, line 44: replace "pules" with --- pulses ---.

Column 5, line 21: replace "ca" with --- can ---.

Column 6, line 29: replace "(rlr$_2$)" with --- ($r_1 r_2$) ---.

UNITED STATES PATENT AND TRADEMARK OFFICE
CERTIFICATE OF CORRECTION

PATENT NO. : 4,000,247
DATED : December 28, 1976
INVENTOR(S) : TOMOAKI YAMADA et al It is certified that error appears in the above-identified patent and that said Letters Patent are hereby corrected as shown below:

Column 3, line 44: replace "Nd"YAG" with --- Nd:YAG ---.

Column 6, line 38: replace "radium" with --- radius ---.

Signed and Sealed this

Sixth Day of December 1977

[SEAL]

Attest:

RUTH C. MASON
*Attesting Officer*

LUTRELLE F. PARKER
*Acting Commissioner of Patents and Trademarks*